United States Patent
Ogimoto

(10) Patent No.: US 9,791,475 B2
(45) Date of Patent: Oct. 17, 2017

(54) NON-CONTACT VOLTAGE MEASURING APPARATUS

(71) Applicant: OMRON Corporation, Kyoto-shi, Kyoto (JP)

(72) Inventor: Mao Ogimoto, Hirakata (JP)

(73) Assignee: OMRON Corporation, Kyoto-shi (JP)

( * ) Notice: Subject to any disclaimer, the term of this patent is extended or adjusted under 35 U.S.C. 154(b) by 0 days.

(21) Appl. No.: 15/106,912

(22) PCT Filed: Jan. 16, 2015

(86) PCT No.: PCT/JP2015/051127
§ 371 (c)(1),
(2) Date: Jun. 21, 2016

(87) PCT Pub. No.: WO2015/115213
PCT Pub. Date: Aug. 6, 2015

(65) Prior Publication Data
US 2017/0038413 A1 Feb. 9, 2017

(30) Foreign Application Priority Data

Jan. 31, 2014 (JP) ................................. 2014-017539

(51) Int. Cl.
*G01R 15/16* (2006.01)
*G01R 15/06* (2006.01)
*G01R 15/14* (2006.01)

(52) U.S. Cl.
CPC .......... *G01R 15/06* (2013.01); *G01R 15/144* (2013.01); *G01R 15/16* (2013.01)

(58) Field of Classification Search
None
See application file for complete search history.

(56) References Cited

U.S. PATENT DOCUMENTS

2002/0171433 A1* 11/2002 Watanabe .............. G01R 15/16
324/539

FOREIGN PATENT DOCUMENTS

JP    H04-311419 A    11/1992
JP    2012-163394 A    8/2012

* cited by examiner

*Primary Examiner* — Paresh Patel
(74) *Attorney, Agent, or Firm* — Metrolexis Law Group, PLLC

(57) ABSTRACT

There is provided a non-contact voltage measuring sensor (1) in which a detection probe (11) is configured with a leaf spring and in which, when an external force is applied, the detection probe (11) deforms winding in a direction in which a tension of the leaf spring acts.

4 Claims, 5 Drawing Sheets

NON-CONTACT VOLTAGE MEASURING APPARATUS

TECHNICAL FIELD

The present invention relates to voltage measuring apparatuses and, in particular, to a non-contact voltage measuring apparatus that measures a voltage applied to a conductive wire without touching the conductive wire.

BACKGROUND ART

Conventionally, a non-contact voltage measuring apparatus that measures an AC voltage (measurement object voltage) flowing through a conductive wire covered with an insulation coating without touching the conductive wire.

The non-contact voltage measuring apparatus measures the measurement object voltage in a manner as described below. A detection probe is brought close to the insulation coating of the conductive wire to detect the voltage. When the insulation coating and the detection probe get in close proximity to each other, a coupling capacitance is created between the detection probe and the conductive wire. If an AC current flows through the conductive wire when a coupling capacitance is created between the detection probe and the conductive wire, an induced voltage is generated on the detection probe. The voltage value of the induced voltage and an electrostatic capacitance value of the coupling capacitance are used to calculate a measurement object voltage.

Patent Document 1 describes, as an example of a non-contact voltage measuring apparatus, a non-contact voltage detecting apparatus equipped with a detection probe covered with a flexible material. Because the detection probe is flexible, a user can improve contact between an electric wire and the detection probe and can increase a contact area between the electric wire and the detection probe by winding the detection probe around an insulation coating of the electric wire. Therefore, a coupling capacitance created between the detection probe and a core wire in the electric wire is increased, and fluctuation (variation) of the coupling capacitance between an electric wire and the detection probe is reduced. A measurement object voltage is measured accurately by using the coupling capacitance that has a large absolute value and a small fluctuation.

PRIOR ART DOCUMENT

Patent Document

Patent Document 1: Japanese Unexamined Patent Publication No. 2012-163394 (Published on Aug. 30, 2012)

SUMMARY OF THE INVENTION

Problems to be Solved by the Invention

However, with the non-contact voltage detecting apparatus described in Patent Document 1, a user needs to manually wind the detection probe around the insulation coating while adjusting a position and a shape of the detection probe. This manual work has a problem requiring time and effort. In addition, there is another problem that there is the possibility of the user getting an electric shock by touching an electric wire cable when the user attaches a voltmeter of the non-contact voltage detecting apparatus to the cable.

The present invention is made in view of the above, and an object of the present invention is to provide an non-contact voltage measuring apparatus with which it is possible to accurately measure a measurement object voltage applied to a conductive wire, by winding an detection probe around the conductive wire coated with an insulation coating without a manual work and by thus increasing a coupling capacitance created between the detection probe and the conductive wire.

Means for Solving the Problem

In order to solve the above problems, an non-contact voltage measuring apparatus according to one aspect of the present invention measures a measurement object voltage applied to a conductive wire, and the non-contact voltage measuring apparatus includes a detection probe configured to measure the measurement object voltage while being wound around the conductive wire. The measurement is based on an induced voltage generated on the detection probe when the detection probe is brought in close proximity to but not in contact with the conductive wire so as to create a coupling capacitance between the detection probe and the conductive wire. The detection probe elastically deforms between a first state in which the detection probe extends in a longitudinal direction of the detection probe against a tension acting in the detection probe and a second state in which the detection probe winds in a direction in which the tension acts.

With the above configuration, the detection probe elastically deforms between the second state in which the detection probe is winding in the direction in which the tension acts and the first state in which the detection probe extends against the above tension. Therefore, if the detection probe elastically deforms from the first state to the second state while the detection probe is being in contact with the conductive wire in such an orientation that a circumferential direction of the conductive wire and the direction in which the tension acts are parallel, the detection probe winds in the direction in which the tension acts, and the detection probe thus winds around the circumference of the conductive wire.

Therefore, a manual work is not necessary to wind the detection probe around the conductive wire to create the coupling capacitance between the detection probe and the conductive wire. Thus, it is possible to reduce time and effort required for the manual work. Further, because a user does not touch the conductive wire when attaching the non-contact voltage detecting apparatus to the conductive wire, the user can safely attach the non-contact voltage detecting apparatus to the conductive wire without a possibility of getting an electric shock.

Further, because the coupling capacitance created between the detection probe and the conductive wire is increased by the detection probe winding around the conductive wire, it is possible to measure the measurement object voltage applied to the conductive wire more accurately.

Effect of the Invention

With the present invention, it is possible to wind the detection probe around the conductive wire coated with an insulation coating without a manual work so that the coupling capacitance created between the detection probe and the conductive wire is increased; thus, it is possible to accurately measure the measurement object voltage applied to the conductive wire.

MODE FOR CARRYING OUT THE INVENTION

Hereinafter, an embodiment of the present invention will be described in detail with reference to FIGS. 1 to 7.

(The Configuration of a Non-contact Voltage Measuring Sensor 1)

Figure 1:
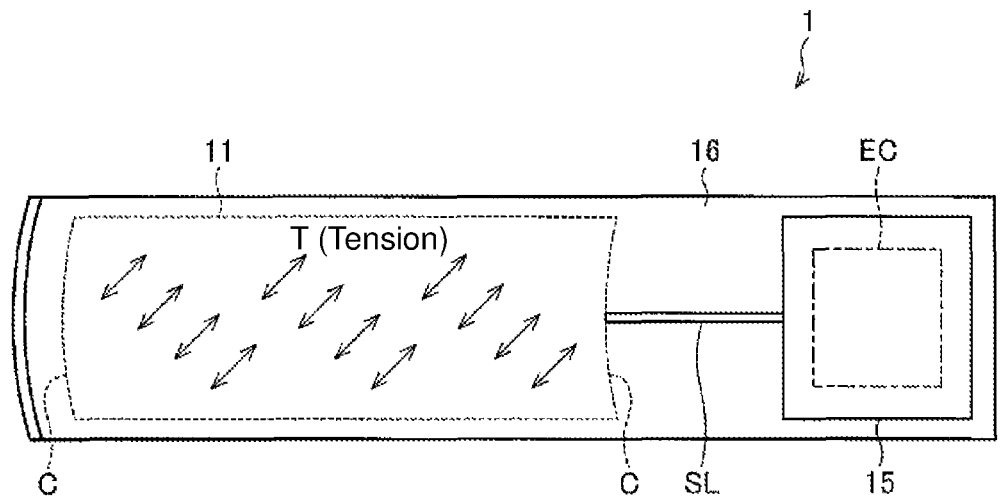
FIG. 1 is a plan view schematically showing an outer appearance of a non-contact voltage measuring sensor according to an embodiment of the present invention and is a diagram showing a detection probe in a curved state.
Figure 2:
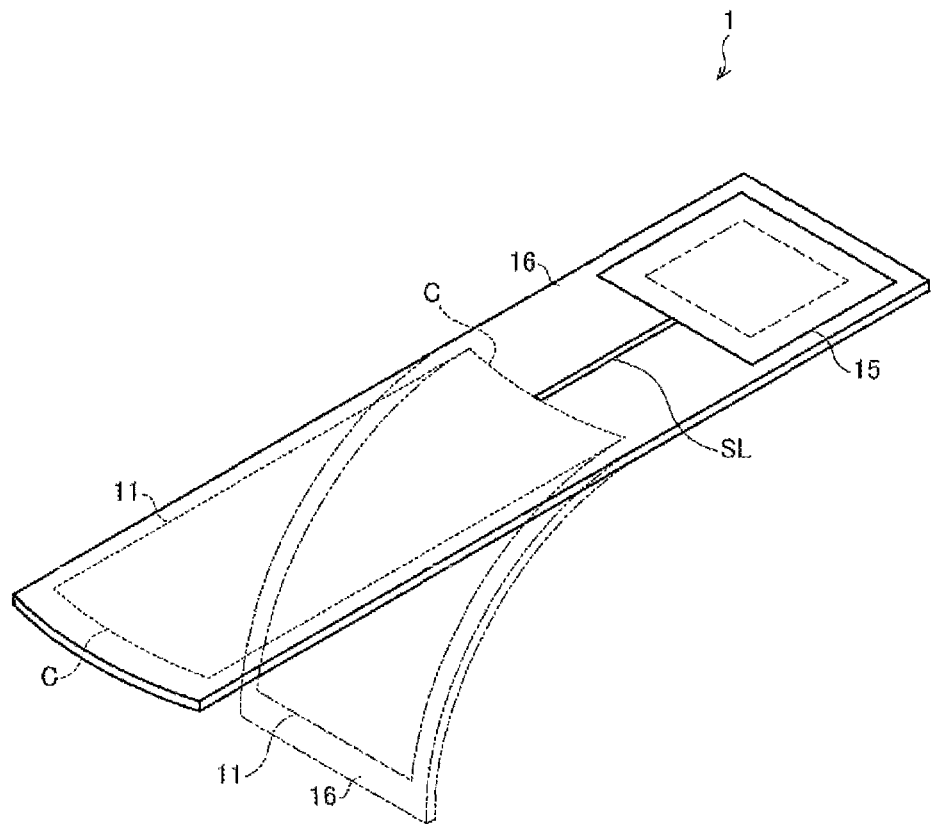
FIG. 2 is a perspective view showing an outer appearance of the non-contact voltage measuring sensor according to an embodiment of the present invention.
Figure 3:
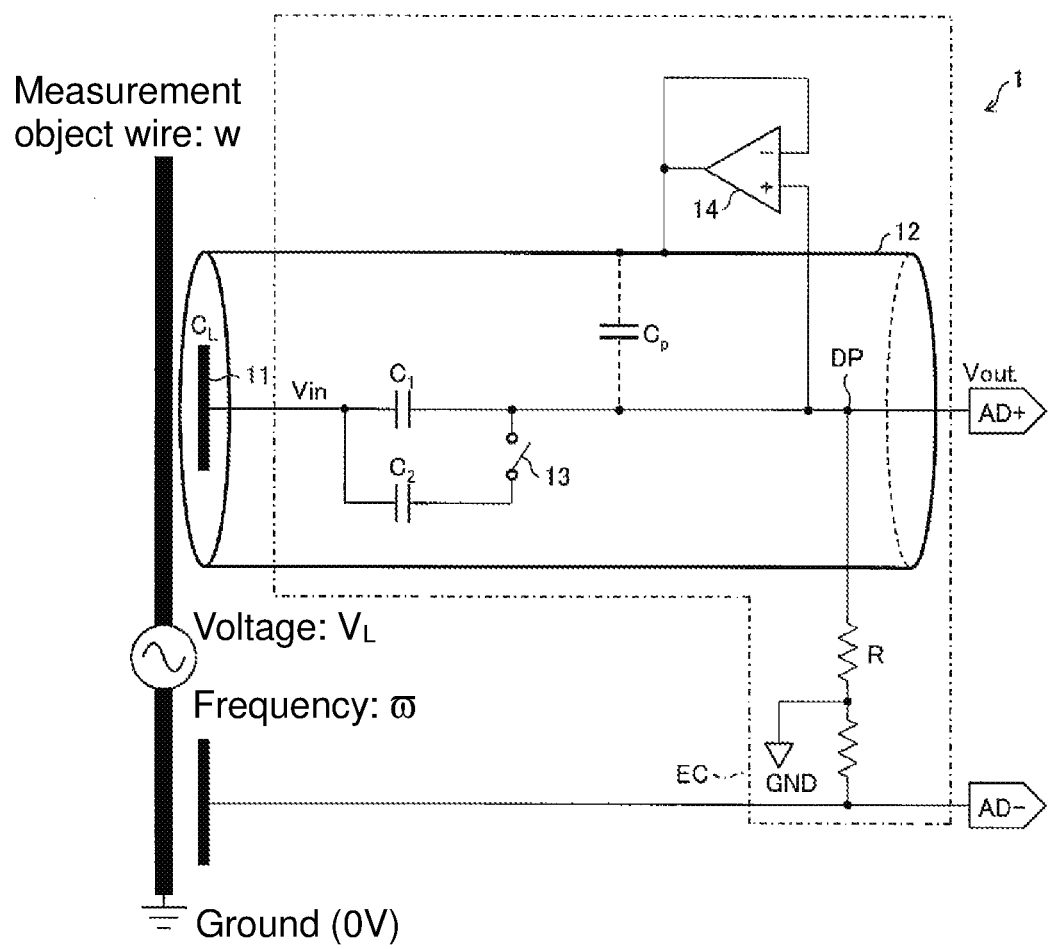
FIG. 3 is a diagram schematically showing a configuration of the non-contact voltage measuring sensor according to an embodiment of the present invention and is a diagram showing an electric circuit equipped with the non-contact voltage measuring sensor.

A configuration of a non-contact voltage measuring sensor (non-contact voltage measuring apparatus) 1 will be described with reference to FIGS. 1 to 3. FIG. 1 is a plan view schematically showing an outer appearance of the non-contact voltage measuring sensor 1. FIG. 2 is a perspective view schematically showing the outer appearance of the non-contact voltage measuring sensor 1. Further, FIG. 3 is a diagram schematically showing a configuration of the non-contact voltage measuring sensor 1 and is a diagram showing an electric circuit EC equipped in the non-contact voltage measuring sensor 1. Hereinafter, the non-contact voltage measuring sensor 1 is briefly referred to as the voltage sensor 1.

The voltage sensor 1 measures an AC voltage $V_L$ (measurement object voltage), which has an angular frequency ω and flows through a core wire (conductive wire) in a measurement object wire w shown in FIG. 3, without touching the core wire. Not shown in the drawing, but the measurement object wire w is coated with an insulation coating, and the core wire of the measurement object wire w is covered with an insulating material.

As shown in FIG. 1, the voltage sensor 1 is equipped with a detection probe 11 and a circuit board 15. The detection probe 11 and the circuit board 15 are electrically connected to each other through a connecting line SL. The detection probe 11 is disposed on the rear surface of a substrate 16. The circuit board 15 is disposed on the surface of the same substrate 16. The substrate 16 is made of a flexible insulator.

In the circuit board 15, there is formed the electric circuit EC. The connecting line SL and the circuit board 15 are laminated with a polyimide seat (not shown) so as not to be exposed to the air.

As shown in FIG. 1, the surface of the voltage sensor 1 is rectangular. A short side of the surface of the voltage sensor 1 (the side extending in the vertical direction in FIG. 1) is, for example, 10 mm to 20 mm. Note that it is preferable that a real length of the long side (the side extending in the lateral direction in FIG. 1) compared with the short side of the voltage sensor 1 be longer than an outer circumference of the measurement object wire w; however, the real length of the long side is not particularly limited.

As shown in FIG. 2, the detection probe 11 and a part of the substrate 16 on which the detection probe 11 is disposed are concavely curved in a cross-section perpendicular to the long side of the surface of the voltage sensor 1. In FIG. 1 and FIG. 2, the symbol c represents the curvature (groove) of the detection probe 11.

As shown in FIG. 3, the electric circuit EC includes capacitors $C_1$ and $C_2$, a detection resistor R, a changeover switch 13, and an operational amplifier 14. The circumference of the detection probe 11 and the electric circuit EC is covered by an electric field shield 12. The capacitors $C_1$ and $C_2$ have known electrostatic capacitance values of 47 pF and 470 pF, respectively.

(1. Detection Probe 11)

The detection probe 11 is made up of a plate-like spring made of copper (copper leaf spring).

As shown in FIG. 3, when the detection probe 11 is in contact with or is sufficiently close to the insulating material covering the core wire of the measurement object wire w, a coupling capacitance $C_L$ having an unknown electrostatic capacitance value is created between the detection probe 11 and the core wire.

As shown in FIG. 1, on the surface of the leaf spring constituting the detection probe 11, a tension T is acting in a direction (the direction indicated by the arrows) inclined with respect to the longitudinal direction (the lateral direction in FIG. 1) of the detection probe 11.

As shown in FIG. 2, the detection probe 11 has a property of tending to elastically deform, due to the tension T in the leaf spring, to a shape in which the detection probe 11 is winding in the direction in which the tension T acts. When the detection probe 11 deforms, the part of the substrate 16 on which the detection probe 11 is disposed also deforms together with the detection probe 11.

The detection probe 11 can be in two kinds of states having different shapes. The first state of the detection probe 11 is a state in which the detection probe 11 has a curvature c and is curved in a gutter shape, as represented by the solid line in FIG. 2. The curvature c works to increase a sectional secondary moment, of the detection probe 11, in the cross-section perpendicular to the longitudinal direction of the detection probe 11, and thus works to inhibit the detection probe 11 from winding. Thus, the detection probe 11 maintains, in the first state, the state of extending in the longitudinal direction.

The second state of the detection probe 11 is a state in which the detection probe 11 is winding in the direction of the tension T with the curvature c removed, as represented by the broken line in FIG. 2. When an external force is applied to the detection probe 11 in the first state, from the surface side or the rear surface side of the voltage sensor 1, the curvature c is removed. Note that the external force applied to the detection probe 11 may be a force applied by a user or may be a reaction force received from the measurement object wire w when the detection probe 11 comes in contact with the measurement object wire w. When the curvature c is removed, the detection probe 11 winds due to the tension T, in the direction in which tension T acts.

As described above, the detection probe 11 shifts from the first state having the curvature c and to the second state in which the curvature c is removed and the detection probe 11 is winding in the direction of the tension T.

In the above description, the state in which "the curvature c is removed" includes a state in which the curvature c is partially removed to such an extent that the detection probe 11 can wind due to the tension T in addition to the state in which the curvature c is completely removed.

When the detection probe 11 shifts from the first state to the second state while being in contact with the outer surface of the measurement object wire w, the detection probe 11 winds so as to wind around the measurement object wire w. For example, in the case that the direction in which the tension T acts is not parallel to the longitudinal direction of the detection probe 11 as shown in FIG. 1, the detection probe 11 winds around the measurement object wire w in a spiral manner (see FIG. 7). Alternatively, in the case that the direction in which the tension T acts is parallel to the longitudinal direction of the detection probe 11, the detection probe 11 winds around the measurement object wire w in a ring-shaped manner.

When the detection probe 11 winds around the measurement object wire w, the coupling capacitance $C_L$ is created between the detection probe 11 and the measurement object wire w (see FIG. 3). At this time, the AC voltage $V_L$ flowing through the core wire in the measurement object wire w causes electrostatic induction on an electric charge in the detection probe 11. This electrostatic conduction generates, in the detection probe 11, a voltage Vin (induced voltage) depending on the voltage $V_L$ and the coupling capacitance $C_L$. The voltage Vin is input to the electric circuit EC through the connecting line SL.

Note that the detection probe 11 in the second state can be returned back to the first state when a pulling force is applied from the both ends to unwind the winding.

Note that the detection probe 11 may have a configuration in which air pressure extends and shortens the detection probe 11 instead of the configuration in which presence or absence of the curvature c extends and shortens the detection probe 11. With this configuration, like a toy called a "party horn", the detection probe 11 maintains the first state, in which the detection probe 11 extends in the longitudinal direction, when the pressure of the air in the detection probe 11 is increased, and the detection probe 11 deforms to the second state when the pressure of the air is decreased.

In the following, a description will be given on how to manufacture the detection probe 11. First, a user prepares a copper-made leaf spring (copper leaf spring) as a material for the detection probe 11.

Figure 4:
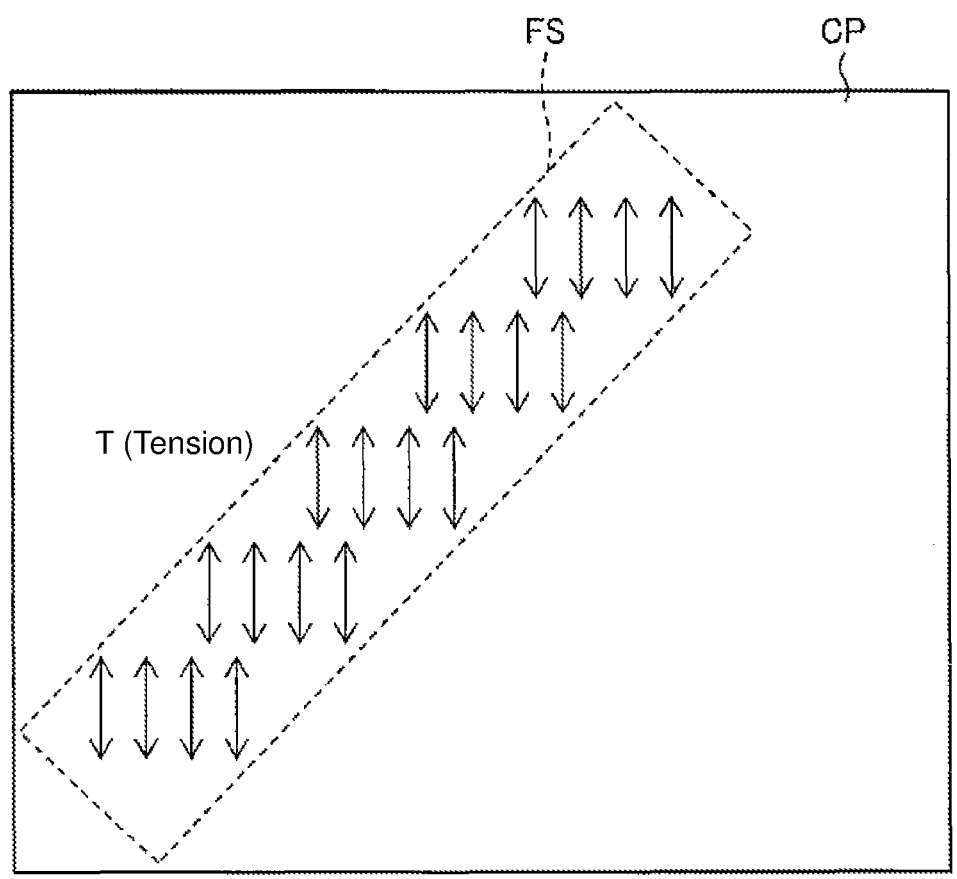
FIG. 4 is a diagram schematically showing a copper leaf spring having a tension acting in a direction vertical to the surface.

FIG. 4 schematically shows a copper leaf spring CP having a tension T acting in the vertical direction with respect to the surface. The copper leaf spring CP has a property of tending to wind in the direction of the tension T. In other words, the original (natural) shape of the copper leaf spring CP is the shape in which the copper leaf spring CP is winding in the direction of the tension T. The user cuts out, as shown in FIG. 4, a rectangular leaf spring FS having a long side not parallel to the direction of the tension T, from the copper leaf spring CP. Next, the rectangular leaf spring FS is curved in a shape of a gutter extending in the longitudinal direction. Thus, the detection probe 11 shown in FIG. 1 and FIG. 2 is completed.

Note that the detection probe 11 may be covered with insulator so that the voltage sensor 1 can measure the voltage $V_L$ of a part at which the core wire of the measurement object wire w is exposed. With this configuration, the user can bring the detection probe 11 close to but not in contact with the core wire by bringing the insulator covering the detection probe 11 in contact with the exposure core wire. With this configuration, an electrode of the detection probe 11 has only to be made of a leaf spring.

Further, as the material for the detection probe 11, a stainless steel leaf spring can be used instead of a copper-made leaf spring. A stainless steel leaf spring has a property of having a larger force to get back to the original shape than a copper-made leaf spring.

Note that, the detection probe 11 does not have to be in a plate shape, and the scope of the present invention includes a detection probe in a rod shape or a wire shape.

(2. Electric Field Shield 12)

The electric field shield 12 blocks an electric field from entering the detection probe 11 or the electric circuit EC from outside, so that the detection probe 11 or the electric circuit EC is prevented from being capacitively coupled to a voltage source other than the core wire of the measurement object wire w. Note that, the electric field shield 12 covers only a part of the electric circuit EC in FIG. 3; however, the electric field shield 12 may cover all the electric circuit EC.

As shown in FIG. 3, there is created a parasitic capacitance Cp between the detection probe 11 and the electric field shield 12. An electrostatic capacitance value of the parasitic capacitance Cp depends on a positional relationship between the detection probe 11 and the electric field shield 12. The parasitic capacitance Cp is obtained through calibration after a position of the detection probe 11 and a position of the electric field shield 12 are fixed, and the parasitic capacitance Cp becomes a known value.

(3. Changeover Switch 13)

The changeover switch 13 switches the electric circuit EC between state (i) in which the capacitor $C_1$ is series connected between the coupling capacitance $C_L$ and the detection resistor R and state (ii) in which a capacitor $C_1$ and a capacitor $C_2$ are series connected between the coupling capacitance $C_L$ and the detection resistor R.

When the electric circuit EC is in state (i), an impedance between the detection probe 11 and the detection resistor R is expressed by $1/j\omega C_1$. On the other hand, when the electric circuit EC is in state (ii), the impedance between the detection probe 11 and the detection resistor R is expressed by $1/j\omega C'_2$. In the above, $C'_2 = C_1 + C_2$.

When the electric circuit EC is in state (i), the voltage Vin being input to the electric circuit EC is divided between the detection resistor R and the capacitor $C_1$. On the other hand, when the electric circuit EC is in state (ii), the voltage $V_L$ is divided between the detection resistor R and the capacitors $C_1$ and $C_2$.

When the electric circuit EC is in state (i) and state (ii), a voltage Vout is detected to be Vout1 and Vout2, respectively, at a detection point DP provided in the electric circuit EC. From the detected voltages, there are obtained two equations including the coupling capacitance $C_L$ and the voltage $V_L$ as unknowns.

Note that, in the embodiment, the detection point DP is provided between the capacitors $C_1$ and $C_2$ and the detection resistor R. Thus, the detection point DP has the same potential as the opposite side of the detection resistor R, having a reference potential point (GND) therebetween. Thus, the voltage Vout is equal to the divided voltage on the detection resistor R.

The coupling capacitance $C_L$ and the voltage $V_L$ are calculated by deforming the two equations such that the coupling capacitance $C_L$ and the voltage $V_L$ are separated. Because how to calculate the values is well known, the detailed description is not given on how to calculate.

(Supplemental Remarks)

The larger absolute value the coupling capacitance $C_L$ has, the smaller the error of the voltage $V_L$ is. The reason will be theoretically described below.

In the electric circuit EC shown in FIG. 3, the voltage $V_L$ is expressed by the following equations.

Mathematical Expressions 1

$$V_L = \frac{1}{j\omega C_L} I_n + \frac{1}{j\omega C_n} I_n + RI_n(C_n : C_1 \text{ or } C'_2(=C_1+C_2)) \quad (1)$$

$$Voutn = RI_n \Rightarrow I_n = \frac{Voutn}{R} \quad (2)$$

In the above equations, $I_1$ and Vout1 are respectively a current and a voltage that are output to an AD converter (AD+ in FIG. 3) when the electric circuit EC is in state (i); and $I_2$ and Vout2 are respectively the current and the voltage that are output to the AD converter when the electric circuit EC is in state (ii). Further, the electrostatic capacitance value of the capacitor $C_2$ is sufficiently larger than the electrostatic capacitance value of the capacitor $C_1$ ($C_1 \ll C_2$).

The following equation is obtained by substituting Equation (2) into Equation (1).

Mathematical Expression 2

$$V_L = \left(\frac{1}{j\omega C_L} + \frac{1}{j\omega C_n}\right)\frac{Voutn}{R} + Voutn$$

$$= \frac{j\omega(C_L + C_n)}{j\omega C_L \cdot j\omega C_n} \cdot \frac{1}{R} \cdot Voutn + Voutn$$

$$= \left(\frac{j\omega(C_L + C_n)}{(j\omega)^2 \cdot C_L \cdot C_n} \cdot \frac{1}{R} + 1\right) \cdot Voutn$$

$$= \left(\frac{C_L + C_n}{j\omega \cdot C_L \cdot C_n} \cdot \frac{1}{R} + 1\right) \cdot Voutn$$

Therefore, the following equations are obtained.

Mathematical Expression 3

$$V_L = \left(1 - j\frac{C_L + C_n}{\omega \cdot C_L \cdot C_n \cdot R}\right) \cdot Voutn$$

Mathematical Expression 4

$$|V_L| = \sqrt{\left(1 + \frac{(C_L + C_n)^2}{\omega^2 \cdot C_L^2 \cdot C_n^2 \cdot R^2}\right)} \cdot |Voutn|$$

Mathematical Expression 5

$$|V_L|^2 = \left(1 + \frac{(C_L + C_n)^2}{\omega^2 \cdot C_L^2 \cdot C_n^2 \cdot R^2}\right) \cdot |Voutn|^2$$

$$= \left(1 + \frac{1}{\omega^2 \cdot C_n^2 \cdot R^2} + \frac{2}{\omega^2 \cdot C_L \cdot C_n \cdot R^2} + \frac{1}{\omega^2 \cdot C_L^2 \cdot R^2}\right) \cdot |Voutn|^2$$

Therefore, the following equation is obtained.

Mathematical Expression 6

$$\frac{d|V_L|^2}{dC_L} = -2\left(\frac{1}{\omega^2 \cdot C_L^2 \cdot C_n \cdot R^2} + \frac{1}{\omega^2 \cdot C_L^3 \cdot R^2}\right) \cdot |Voutn|^2$$

Therefore, the following equation is obtained.

Mathematical Expression 7

$$\therefore C_L \to \infty \quad \frac{d|V_L|^2}{dC_L} = 0$$

Figure 5:
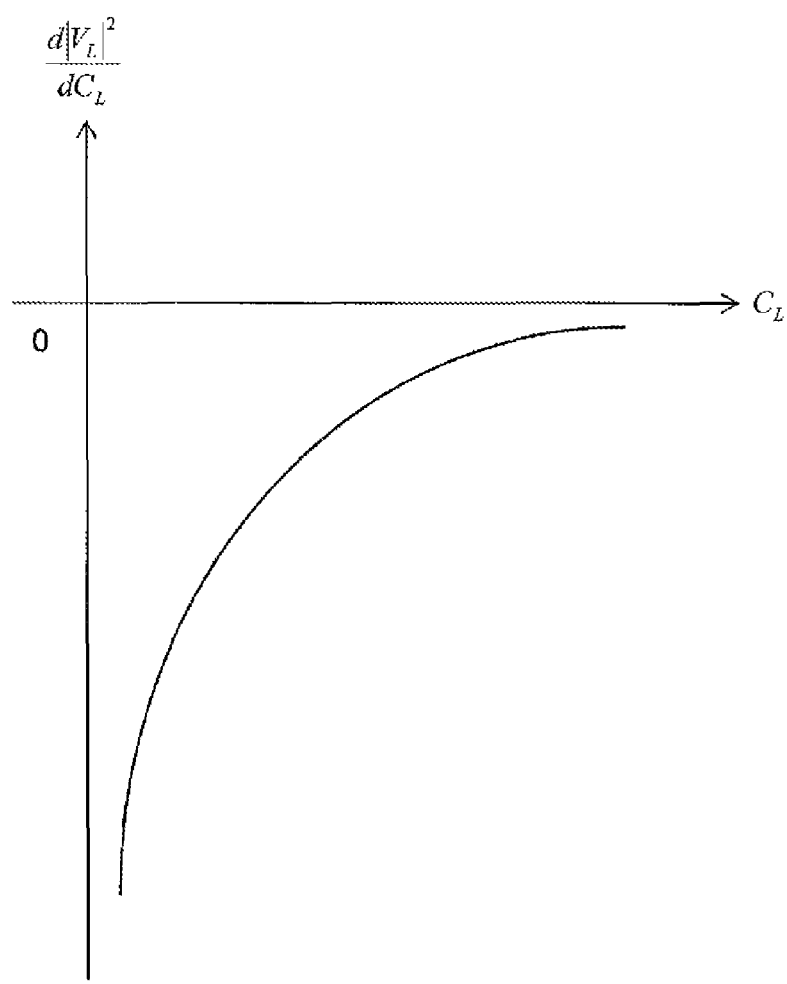
FIG. 5 is another diagram showing the relationship between a coupling capacitance and a measurement object voltage and is a diagram showing a graph illustrating the relationship between an electrostatic capacitance value of the coupling capacitance and a second-order differentiation of an absolute value of the measurement object voltage.

In FIG. 5, the graph shows the relationship between a second-order differentiation $d|V_L|^2/dC_L$ of an absolute value of the voltage $V_L$ and the coupling capacitance $C_L$. The graph shown in FIG. 5 shows that the larger the electrostatic capacitance value of the coupling capacitance $C_L$ is, the smaller a fluctuation of $d|V_L|^2/dC_L$ is. This theoretically shows that the lager the electrostatic capacitance value of the coupling capacitance $C_L$ is, the smaller the fluctuation and the error of the measurement values of $V_L$ are.

(4. Operational Amplifier 14)

An operational amplifier 14 maintains a state in which the potential of the detection point DP and the potential of the electric field shield 12 are the same. Thus, almost no leakage current flows through the parasitic capacitance Cp (electrostatic capacitance value of approximately 5 pF) created between the detection point DP and the electric field shield 12. In other words, the operational amplifier 14 reduces the leakage current flowing through the parasitic capacitance Cp down to a negligible amplitude. This arrangement can reduce influence of the leakage current flowing through the parasitic capacitance Cp to the measurement value of the voltage $V_L$.

(How to Measure the Voltage by the Non-contact Voltage Measuring Sensor 1)

Hereinafter, a description will be given on how to measure the voltage by the voltage sensor 1.

Figure 6:
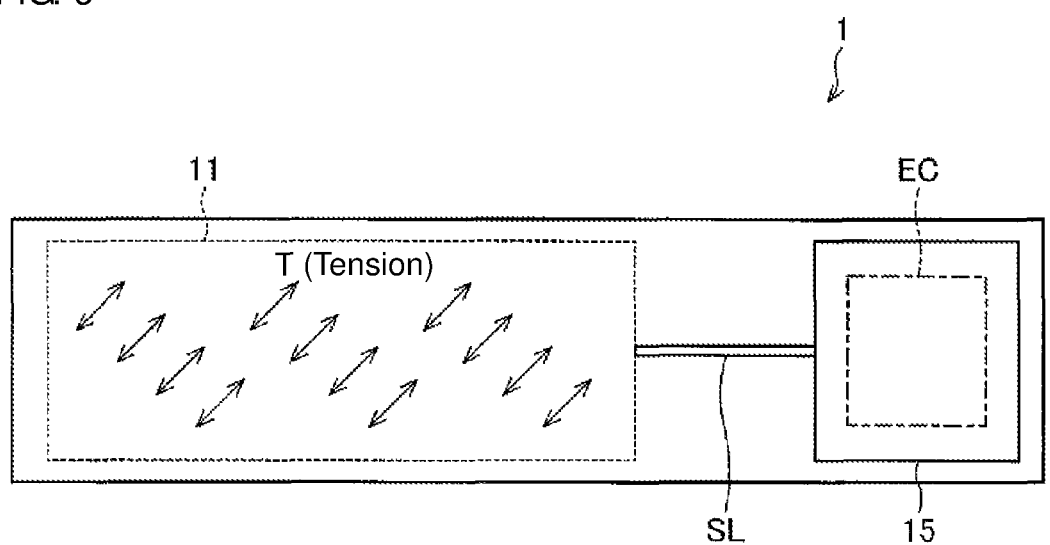
FIG. 6 is another plan view showing the outer appearance of the non-contact voltage measuring sensor according to an embodiment of the present invention and is a diagram showing the detection probe in a state in which a curvature is removed.

First, the user pushes a part of the detection probe 11 to remove the curvature c. Then, the user holds the both ends of the detection probe 11 so that the detection probe 11 does not wind and maintains the state of extending in the longitudinal direction. FIG. 6 shows the detection probe 11 when the curvature c is removed and the detection probe 11 extends in the longitudinal direction.

Next, the user brings the detection probe 11 close to the measurement object wire w while pressing the part of the detection probe 11. At this time, the user brings the detection probe 11 close to the measurement object wire w, keeping the state that the longitudinal direction of the measurement object wire w and the longitudinal direction of the detection probe 11 are crossing each other in such a manner that the direction in which the tension T of the detection probe 11 acts and the circumferential direction of the measurement object wire w are parallel.

Figure 7:
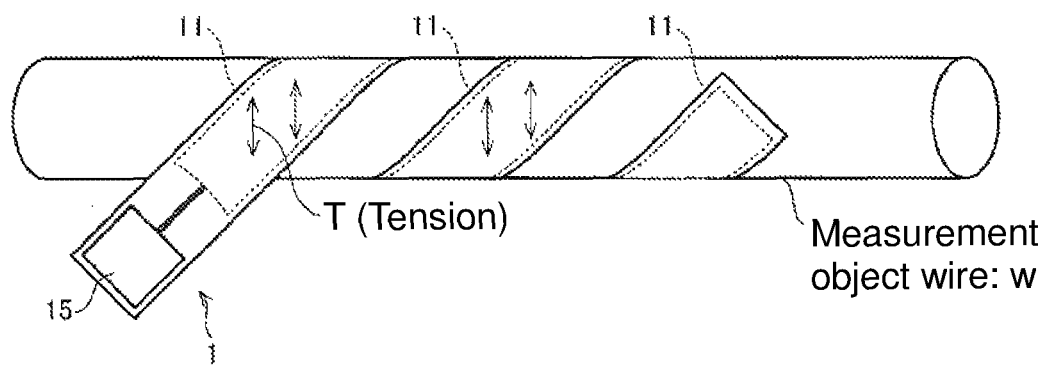
FIG. 7 is a diagram showing an example in which the detection probe of the non-contact voltage measuring sensor according to an embodiment of the present invention is winding around a measurement object wire.

When the detection probe 11 gets sufficiently close to the measurement object wire w, the user releases their hold on the detection probe 11. Then, the detection probe 11 winds in the direction in which the tension T acts and thus automatically winds around the measurement object wire w in a spiral manner. FIG. 7 shows an example in which the detection probe 11 winds around the measurement object wire w in a spiral manner.

Note that the detection probe 11 can wind around the measurement object wire w regardless of the size of the diameter of the measurement object wire w.

When the detection probe 11 is winding around the measurement object wire w with m turns, the coupling capacitance $C_L$ is expressed by the following equation.

Mathematical Expression 8

$$C_L = 2\pi\epsilon_0 \epsilon r L / \log(a/b) \times m$$

In the above, a is a radius of the core wire (cylindrical shape) in the measurement object wire w; b is a thickness of the insulation coating (hollow cylindrical shape); L is the length of the short side of the detection probe 11 (see FIG. 6); and $\epsilon_0$ is the dielectric constant of vacuum.

As the above equation shows, as the number of turns m with which the detection probe 11 is winding around the measurement object wire w is larger, the coupling capacitance $C_L$ created between the core wire in the measurement object wire w and the detection probe 11 is larger. For example, in the configuration in which the detection probe 11 is winding around the measurement object wire w with two turns, the absolute value of the coupling capacitance $C_L$ is four times the absolute value of the coupling capacitance $C_L$ in the configuration in which the detection probe 11 is winding with half a turn. As described above, the larger the absolute value of the coupling capacitance $C_L$ is, the smaller the error of the voltage $V_L$ is.

Further, as the coupling capacitance $C_L$ is larger, the voltage Vout is also larger. Because the rate of an error occupying the detection value of the voltage Vout is smaller as the voltage Vout is larger, the larger voltage Vout has a smaller fluctuation and a higher reliability. Therefore, the voltage $V_L$ can be calculated with a high precision, using a larger voltage Vout.

The present invention is not limited to the above-described embodiment, and various modification can be made within the scope recited in the claims.

[Summary of the Description]

A non-contact voltage measuring apparatus according to one aspect of the present invention measures a measurement object voltage applied to a conductive wire, and the non-contact voltage measuring apparatus includes a detection probe configured to measure the measurement object voltage while being wound around the conductive wire. The measurement is based on an induced voltage generated on the detection probe when the detection probe is brought in close proximity to but not in contact with the conductive wire so as to create a coupling capacitance between the detection probe and the conductive wire. The detection probe elastically deforms between a first state in which the detection probe extends in a longitudinal direction of the detection probe against a tension acting in the detection probe and a second state in which the detection probe winds in a direction in which the tension acts.

With the above configuration, the detection probe elastically deforms between the second state in which the detection probe is winding in the direction in which the tension acts and the first state in which the detection probe extends against the above tension. Therefore, when the detection probe elastically deforms from the first state to the second state while the detection probe is in contact with the conductive wire in such an orientation that a circumferential direction of the conductive wire and the direction in which the tension acts are parallel, the detection probe winds in the direction in which the tension acts so that detection probe winds around the circumference of the conductive wire.

Therefore, a manual work is not necessary to wind the detection probe around the conductive wire so as to create the coupling capacitance between the detection probe and the conductive wire. Thus, it is possible to reduce time and effort required for the manual work. Further, because a user does not touch the conductive wire when attaching the non-contact voltage detecting apparatus to the conductive wire, the user can safely attach the non-contact voltage detecting apparatus to the conductive wire without a possibility of getting an electric shock.

Further, because the coupling capacitance created between the detection probe and the conductive wire is increased by the detection probe winding around the conductive wire, it is possible to measure the measurement object voltage applied to the conductive wire more accurately.

Further, in the non-contact voltage measuring apparatus, the detection probe is configured with a leaf spring, and when an external force is applied while the detection probe is in the first state, the detection probe may change to the second state by winding in a direction in which the tension of the leaf spring acts.

With the above configuration, when an external force is applied, the detection probe in the first state that has extended against the tension changes to the second state by winding in the direction in which the tension of the leaf spring acts. Therefore, when an external force is applied while the detection probe is in contact with the conductive wire in such an orientation that a circumferential direction of the conductive wire and the direction in which the tension acts are parallel, the detection probe winds in the direction in which the tension acts so that detection probe winds around the circumference of the conductive wire.

For example, if the direction in which the tension of the leaf spring acts is parallel to the longitudinal direction of the detection probe, the detection probe winds around the conductive wire in a ring shape. Alternatively, if the direction in which the tension of the leaf spring acts is oblique to the longitudinal direction of the detection probe, the detection probe winds around the conductive wire in a spiral manner.

Therefore, a manual work is not necessary to wind the detection probe around the conductive wire, as described above. Thus, it is possible to reduce time and effort required for the manual work. Further, because a user does not touch the conductive wire when attaching the non-contact voltage detecting apparatus to the conductive wire, the user can safely attach the non-contact voltage detecting apparatus to the conductive wire without a possibility of getting an electric shock.

Further, in the above non-contact voltage measuring apparatus, the direction in which the tension acts may be oblique to the longitudinal direction of the detection probe.

Further, with the above configuration, when the circumferential direction of the conductive wire and the direction in which the tension acts are parallel to each other, the longitudinal direction of the detection probe is not parallel to any of the circumferential direction and the longitudinal direction of the conductive wire. When at least a part of detection probe comes in contact with the conductive wire while the longitudinal direction of the detection probe is not parallel to the longitudinal direction of the conductive wire, the detection probe winds around the conductive wire in a spiral manner due to the tension of the leaf spring.

Thus, the detection probe can wind around the conductive wire with one or more turns. As the number of turns with which the detection probe winds around the conductive wire is larger, the higher coupling capacitance can be created between the detection probe and the conductive wire. As a result, the measurement object voltage can be obtained at a high precision.

Further, in the above non-contact voltage measuring apparatus, the detection probe in the first state may have a curvature in the shape of a gutter extending in the longitudinal direction of the detection probe.

With the above configuration, because the detection probe in the first state has a curvature in the shape of a gutter extending in the longitudinal direction, the detection probe has a large sectional secondary moment in the cross-section perpendicular to the extending direction of the curvature. Therefore, it is difficult for the detection probe in the first state to wind in the longitudinal direction. Thus, the detection probe can maintain the state of extending in the longitudinal direction.

When an external force is applied to the detection probe in the first state, specifically when a user pushes a part of the detection probe, the curvature of the detection probe is removed. Then, the detection probe deforms into the second state due to the tension of the leaf spring, and thus winds around the conductive wire.

INDUSTRIAL APPLICABILITY

The present invention can be used for a non-contact voltage measuring apparatus that measures a voltage applied to a conductive wire without touching the conductive wire.

DESCRIPTION OF SYMBOLS

1 Non-contact voltage measuring sensor (non-contact voltage measuring apparatus)
11 Detection probe
w Measurement object wire (core wire of a measurement object wire; conductive wire)
Vin Voltage (induced voltage)
$V_L$ Voltage (measurement object voltage)
$C_L$ Coupling capacitance
T Tension

The invention claimed is:

1. A non-contact voltage measuring apparatus that measures a measurement object voltage applied to a conductive wire, the non-contact voltage measuring apparatus comprising:
   a detection probe configured to measure the measurement object voltage, while being wound around the conductive wire, based on an induced voltage generated on the detection probe when the detection probe is brought in close proximity to but not in contact with the conductive wire so as to create a coupling capacitance between the detection probe and the conductive wire,
   wherein the detection probe elastically deforms between a first state in which the detection probe extends in a longitudinal direction of the detection probe against a tension acting in the detection probe and a second state in which the detection probe winds in a direction in which the tension acts, and
   the direction in which the tension acts is oblique to the longitudinal direction of the detection probe.

2. The non-contact voltage measuring apparatus according to claim 1, wherein the detection probe is configured with a leaf spring, and when an external force is applied while the detection probe is in the first state, the detection probe changes to the second state by winding in a direction in which the tension of the leaf spring acts.

3. The non-contact voltage measuring apparatus according to claim 1, wherein, in the first state, the detection probe has a curvature in a shape of a gutter extending in the longitudinal direction of the detection probe.

4. The non-contact voltage measuring apparatus according to claim 2, wherein, in the first state, the detection probe has a curvature in a shape of a gutter extending in the longitudinal direction of the detection probe.

* * * * *